United States Patent
Ajiki et al.

(10) Patent No.: US 7,504,272 B2
(45) Date of Patent: Mar. 17, 2009

(54) METHOD FOR PRODUCING COLOR-CONVERTING LIGHT-EMITTING DEVICE USING ELECTROPHORESIS

(75) Inventors: Shuichi Ajiki, Tokyo (JP); Toshinobu Kashima, Tokyo (JP); Tsutomu Akagi, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 11/935,103

(22) Filed: Nov. 5, 2007

(65) Prior Publication Data

US 2008/0108159 A1    May 8, 2008

(30) Foreign Application Priority Data

Nov. 6, 2006    (JP) ............................. 2006-300722
Nov. 17, 2006   (JP) ............................. 2006-311787

(51) Int. Cl.
*H01L 21/00* (2006.01)
(52) U.S. Cl. ................... 438/29; 438/678; 427/157; 204/298.06; 205/758
(58) Field of Classification Search ................ 438/22, 438/29, 678; 204/450, 454, 411, 412, 297.12, 204/298.06, 674; 427/157; 205/653, 758
See application file for complete search history.

(56) References Cited

U.S. PATENT DOCUMENTS 6,432,821 B1 * 8/2002 Dubin et al. ................ 438/678
6,576,488 B2   6/2003 Collins, III et al.
6,864,110 B2 * 3/2005 Summers et al. ............. 438/22
2004/0198132 A1 * 10/2004 Tuck ........................... 445/50
2008/0173544 A1 * 7/2008 Seul et al. ................... 204/478

FOREIGN PATENT DOCUMENTS

JP         2003069086         3/2003

* cited by examiner

*Primary Examiner*—W. David Coleman
(74) *Attorney, Agent, or Firm*—Cermak Kenealy Vaidya & Nakajima LLP

(57) ABSTRACT

A method for producing a color-converting light-emitting device is provided that can prevent the deposition of elements caused by ion migration during an electrophoresis process used to deposit a phosphor layer on the light emitting device. An anode and a light-emitting device having a semiconductor light-emitting element are disposed in a solution in which phosphor particles are dispersed. An auxiliary cathode can be disposed between the light-emitting device and the anode. A DC voltage can be applied between one electrode of the light-emitting device and the anode so that the electrical potential of the electrode is lower than that of the anode, thereby moving the particles to a surface of the semiconductor light-emitting element and allowing them to deposit thereon. The electrical potential of the auxiliary cathode is maintained lower than that of the surface of the semiconductor light-emitting element. In this manner, cations dissolved from metallic regions of the light-emitting device can be attracted to the auxiliary cathode and prevented from being deposited on a surface of the light emitting device.

21 Claims, 10 Drawing Sheets

Moving direction of phosphor particles by electrophoresis

Moving direction of phosphor particles by electrophoresis

Moving direction of phosphor particles by electrophoresis

METHOD FOR PRODUCING COLOR-CONVERTING LIGHT-EMITTING DEVICE USING ELECTROPHORESIS

This application claims the priority benefit under 35 U.S.C. § 119 of Japanese Patent Application No. 2006-300722 filed on Nov. 6, 2006 and Japanese Patent Application No. 2006-311787 filed on Nov. 17, 2006, which are hereby incorporated in their entirety by reference.

BACKGROUND

1. Technical Field

The presently disclosed subject matter relates to a method for producing a color-converting light-emitting device having a light-color converting material layer that is formed on a surface of a light-emitting element and converts the color of light emitted from the light-emitting element.

2. Description of the Related Art

Optical devices are known that include a light-color converting material (for example, a phosphor) for converting the blue light of a light-emitting diode (LED) into red and green light to emit white light as a combination of red, green and blue light. One such known optical device includes a blue LED chip arranged within a cup having a reflective inner surface. The inner space of the cup around the LED chip is filled with a phosphor.

In some cases, uneven colors may be caused by the formation of uneven phosphor layer around the LED chip. Japanese Patent Application Laid-Open No. 2003-69086 (corresponding to U.S. Pat. No. 6,576,488 which is hereby incorporated in its entirety by reference) describes a technique in which a phosphor layer of uniform thickness is formed and adhered on the surface of an LED chip by electrophoresis in order to reduce the occurrence of uneven colors. In this technique, phosphor particles, and aluminum nitride serving as both a charging agent and a binder are dispersed in a solution composed mainly of isopropyl alcohol and water. In the electrophoresis process, an LED chip is placed in this solution along with its support member (submount) that also serves as a cathode. An anode is also arranged opposite to the cathode. An electric field is then applied between the thusly arranged cathode and anode, causing the phosphor particles, which are positively charged by the charging agent, to be electrophoresed (moved) toward the cathode and deposited on the conductive part of the LED chip surface to form a phosphor layer.

As described above, the LED chip and its support member are immersed in the solution during the electrophoresis process and a voltage is applied to them. As a result, the elements present in the LED chip and the support member may dissolve into the solution by ion migration when specific conditions are met. The specific conditions mean that two or more regions of the LED and the support member contain the same element selected from Ag, Pb, Cu, Sn, and Ni, the elements known for their tendency to undergo ion migration, and an electrical potential difference exists between these regions. When these conditions are met, the element in a high potential region is ionized and dissolved in the solution and the dissolved ions migrate to a lower potential region where they deposit, a phenomenon known as ion migration. Of the elements described above, Ag has a particularly high tendency to undergo ion migration.

These elements/materials are conductive and can cause short circuits when they deposit between the adjacent electrode patterns, lowering the reliability of the device. Similar to the phosphor particles, the dissolved ions are positively charged and thus electrophoresed to the lower potential surface of the LED chip where they deposit. The crystallized element form fine particles smaller than the visible wavelength in size. These particles form black-colored light-absorbing spots in the phosphor layer, resulting in a decrease in the luminance of the LED device.

SUMMARY

In view of the foregoing and other problems and characteristics, the presently disclosed subject matter provides a method for producing a color-converting light-emitting device that can prevent the deposition of elements caused by ion migration during electrophoresis to deposit a light-color converting material layer.

In accordance with an aspect of the presently disclosed subject matter, an auxiliary cathode can be arranged between the anode and the semiconductor light-emitting device onto which the light-color converting material particles are to be deposited by electrophoresis. By making the potential of the auxiliary cathode lower than that of the surface of the light-emitting element of the semiconductor light-emitting device, the cations dissolved from the metallic region of the light-emitting device by ion migration can be attracted to the auxiliary cathode.

Specifically, a method for producing a color-converting light-emitting device according to an aspect of the disclosed subject matter can include preparing an electrodeposition apparatus including an anode, an auxiliary cathode, a solution that has light-color converting material particles dispersed therein, and a processing tank configured to accommodate the anode, the auxiliary cathode and the solution, arranging the anode and a light-emitting device having an electrode and a semiconductor light-emitting element mounted thereon in the solution so that the anode and the light-emitting device are opposite to each other, arranging the auxiliary cathode interposed between the light-emitting device and the anode, and electrically connecting the electrode of the light-emitting device to the auxiliary cathode, and applying a DC voltage between the electrode and the anode so that an electrical potential of the electrode and the auxiliary cathode is lower than that of the anode, so as to cause the light-color converting material particles in the solution to migrate to the semiconductor light-emitting element and deposit on a surface of the semiconductor light-emitting element. According to this method, the ions of elements dissolved from the metallic region of the light-emitting device by ion migration can be attracted to the auxiliary cathode and, thus, the deposition of the elements on the surface of the semiconductor light-emitting element can be prevented.

A second aspect in accordance with the presently disclosed subject matter provides the following production method of a color-converting light-emitting device: A method for producing a color-converting light-emitting device, comprising: preparing an electrodeposition apparatus including an anode, an auxiliary cathode, a solution that has light-color converting material particles dispersed therein, and a processing tank configured to accommodate the anode, the auxiliary cathode and the solution; arranging the anode and a light-emitting device having an electrode and a semiconductor light-emitting element mounted thereon in the solution so that the anode and the light-emitting device are opposite to each other; and arranging the auxiliary cathode interposed between the light-emitting device and the anode; and applying a DC voltage between the electrode of the light-emitting device and the anode so that an electrical potential of the electrode is lower than that of the anode, so as to cause the light-color converting material particles in the solution to migrate to the semiconductor light-emitting element and deposit on a surface of the semiconductor light-emitting element while an electrical potential of the auxiliary cathode is maintained lower than that of the surface of the semiconductor light-emitting element.

A third aspect in accordance with the presently disclosed subject matter provides the production method of a color-converting light-emitting device in which the electrical potential of the auxiliary cathode is maintained lower than that of the surface of the semiconductor light-emitting element. In this manner, even when the cations are dissolved from the metallic region of the light-emitting device due to ion migration, they can be attracted to the auxiliary cathode.

In the method for producing a color-converting light-emitting device, the auxiliary cathode may include a plurality of pores for allowing the light-color converting material particles to pass therethrough. In this manner, the light-color converting material particles can pass through the pores in the auxiliary cathode and deposit on the semiconductor light-emitting element. The auxiliary cathode may be greater in size than the semiconductor light-emitting element and may include a window formed at the position opposite to the semiconductor light-emitting element. The window may be sized to correspond to the semiconductor light-emitting element. In this manner, the light-color converting material particles are prevented from depositing on the light-emitting device in the area other than the semiconductor light-emitting element.

The auxiliary cathode may be a planar cathode that is greater in size than the semiconductor light-emitting element and includes a window that corresponds to the semiconductor light-emitting element both in size and position. The window is sized to correspond to the semiconductor light-emitting element. In this manner, the light-color converting material is prevented from depositing on the light-emitting device in areas other than the semiconductor light-emitting element.

When the light-emitting device as described above includes two or more metallic regions containing the same element selected from Ag, Pb, Cu, Sn and Ni, and a potential difference exists between these metallic regions during the deposition of the light-color converting material particles, cations dissolve from the region of the highest potential, causing ion migration. By attracting the cations dissolved from the metallic region of the light-emitting device toward the auxiliary cathode, deposition of the element derived from the cations on the semiconductor light-emitting element can be prevented.

The above-described auxiliary cathode may have a conductor which has a part of arranged at a position opposite to the metallic region of higher potential where a potential difference may occur. In this manner, the cations dissolved from the metallic region of the higher potential can be effectively attracted to the auxiliary cathode.

When the light-emitting device includes electrodes with two or more metallic regions containing the same element selected from Ag, Pb, Cu, Sn, and Ni, the auxiliary cathode may have a conductor that has a part of which is arranged at a position opposite to the electrode of the higher potential. In this manner, the cations dissolved from the metallic region of the higher potential can be effectively attracted to the auxiliary cathode.

Further to the above, and in accordance with another aspect of the presently disclosed subject matter, when a light-emitting device has two or more metallic parts in which ion migration may occur during electrophoresis, these metallic parts can be electrically connected to each other or to an electrode having, for example, a ground potential, thereby allowing these metallic parts to have the same electrical potential (or ground potential).

Ion migration may occur when two or more regions containing the same element exist and there is a potential difference between these regions. Accordingly, ion migration may be prevented by connecting these regions to allow these regions to have the same electrical potential. Furthermore, when electrophoresis is performed, the entire surface including the connected metallic parts is covered with light-color converting material particles. Accordingly, an auxiliary cathode having a window may be arranged at a certain position so that the light-color converting material particles are allowed to selectively deposit on a desired area.

Specifically, another aspect in accordance with the presently disclosed subject matter provides the following production method of a color-converting light-emitting device: A method for producing a color-converting light-emitting device, comprising: preparing an electrodeposition apparatus including an anode, a solution that has light-color converting material particles dispersed therein, and a processing tank configured to accommodate the anode and the solution; arranging the anode and a light-emitting device having a plurality of conductive portions and a semiconductor light-emitting element mounted thereon in the solution so that the anode and the light-emitting device are opposite to each other; and electrically connecting at least two of the plurality of conductive portions of the light-emitting device in order to allow the conductive portions to have the same electrical potential; applying a DC voltage between the light-emitting device and the anode so that an electrical potential of the semiconductor light-emitting element at a location where the light-color converting material particles are to be deposited is lower than that of the anode, so as to cause the light-color converting material particles in the solution to migrate to the semiconductor light-emitting element and deposit on a surface of the semiconductor light-emitting element; and cutting the connection of the plurality of conductive portions. Accordingly, at least two of the plurality of conductive portions are connected so as to be allowed to have the same electrical potential, thereby preventing ion migration even when these conductive portions contain the same element such as Ag, Pb, Cu, Sn, or Ni.

In the above method, the electrodeposition apparatus may further include an auxiliary cathode interposed between the light-emitting device and the anode, and the at least two of the plurality of conductive portions are connected via the auxiliary cathode so as to allow the auxiliary cathode and the at least two of the plurality of conductive portions to have the same electrical potential. The auxiliary cathode may include a window formed at a position opposite to the semiconductor light-emitting element such that the light-color converting material particles having passed through the window can be allowed to selectively deposit on the semiconductor light-emitting element. In this manner, the auxiliary cathode can serve as a mask and the light-color converting material particles are prevented from depositing on the light-emitting device in any unnecessary or undesirable area.

When a conductive layer is disposed in an area of the semiconductor light-emitting element where light-color converting material particles are to be deposited, the conductive layer can be connected to the at least two of the plurality of conductive portions so as to allow the conductive layer and the at least two of the plurality of desired conductive portions to have the same electrical potential. Accordingly, even when the conductive layer contains any element which has a high tendency to undergo ion migration, ion migration may be prevented and a light-color converting material layer can be deposited on that area.

When the light-emitting device includes a reflector member having a metallic layer formed in the surface thereof, the metallic layer of the reflector member may be connected to any of the at least two of the plurality of conductive portions so as to have the same electrical potential as that of the conductive portions. Accordingly, even when the metallic layer of the reflector member contains any element which has a high tendency to undergo ion migration, ion migration may be prevented.

In the above-described method, the light-color converting material may be a phosphor material including, for example, a YAG (yttrium/aluminum/garnet) phosphor.

BRIEF DESCRIPTION OF THE DRAWINGS

These and other characteristics, features, and advantages of the presently disclosed subject matter will become clear from the following description with reference to the accompanying drawings, wherein.

DETAILED DESCRIPTION OF EXEMPLARY EMBODIMENTS

A description will now be given of exemplary embodiments of a method for producing a color-converting light-emitting device in accordance with the presently disclosed subject matter in detail with reference to the accompanying drawings.

Figure 1:
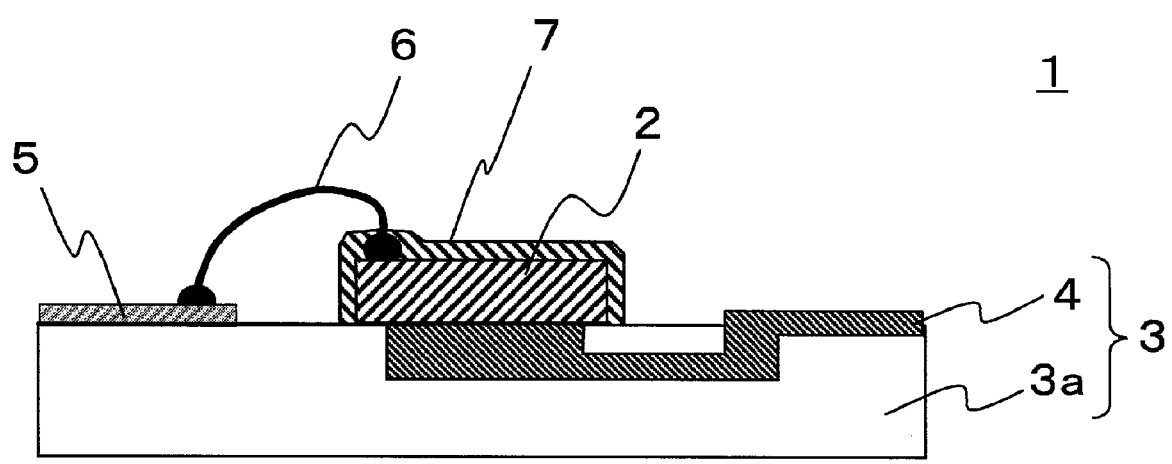
FIG. 1 is a cross-sectional view of an example of a color-converting light-emitting device produced in accordance with one exemplary embodiment of the presently disclosed subject matter.

Referring first to FIG. 1, the structure of an exemplary color-converting light-emitting device is described. The color-converting light-emitting device of FIG. 1 can include a support member 3 and a GaN-based blue LED chip (die) 2 mounted on the support member 3. The blue LED chip 2 is covered with a light-color converting material layer 7.

The support member 3 is configured to include an insulative substrate 3a, and a p-type contact leading electrode 4 and an n-type contact leading electrode 5 arranged on the surface of the substrate 3a. The LED chip 2 may be a conventional blue LED and may include a p-type contact layer with a low electrical resistance, a p-type cladding layer, an active layer, an n-type cladding layer, and an n-type contact layer with a low electrical resistance. These layers may sequentially be stacked on the substrate member 3 (the layered structure is not shown in detail). A surface electrode is arranged on the n-type contact layer to serve as a bonding pad. The p-type contact layer at the bottom of the LED chip 2 is die-bonded to the p-type contact leading electrode 4 on the support member 3 using a soldering material or the like. The surface electrode of the LED chip 2 is connected to the n-type contact leading electrode 5 via a bonding wire 6.

The light-color converting material layer 7 covering the blue LED chip 2 may be a layer of YAG (yttrium/aluminum/garnet) phosphor particles. Hereinafter, the light-color converting material layer may be referred to as the "phosphor layer" 7. In the presently disclosed subject matter, the light-color converting material is not limited to this, and examples thereof can include various known phosphor materials for converting light color into another light color, such as TAG, BAM ($BaMgAl_{10}O_{17}$:Eu), CASN ($CaAlSiN_3$:$Eu^{2+}$), SiAlON, fluorescents, etc.

In the color-converting light-emitting device shown in FIG. 1, the LED chip 2 emits blue light when a current flows through the p-type contact leading electrode 4 and the n-type contact leading electrode 5 to the LED chip 2. The phosphor layer 7 can absorb some of the blue light and convert it into yellow fluorescent light. As a result, the color-converting light-emitting device emits white light resulting from the mixture of the yellow light and the blue light.

The production method of the color-converting light-emitting device in accordance with the presently disclosed subject matter will be briefly described.

First, the pre-made LED chip 2 is die-bonded to the p-type contact leading electrode 4 on the support member using, for example, a soldering material. The surface electrode of the LED chip 2 is then bonded to the n-type contact leading electrode 5 via the wire 6. This completes the LED package 1 having the LED chip 1 mounted on the support member 3. The production methods of the LED chip 2 and the support member 3 are widely known and will not be described here.

The phosphor layer 7 is then deposited on the surface of the LED chip 2 of the LED package 1 by electrophoresis. The electrophoresis is essentially a process in which a voltage is applied between two electrodes (an anode and a cathode) to cause charged materials present between the electrodes to migrate in the resulting electric field. The electrophoresis can be used to deposit the charged materials on one of the electrodes that is oppositely charged. This process is referred to as an electrophoresis electrodeposition process or, simply, an electrodeposition process, hereinafter. In the present exemplary embodiment, charged phosphor particles are dispersed in an aqueous solution and the LED package 1 serving as the cathode is immersed in the solution. The cathode is arranged opposite to the anode. Applying a voltage between the cathode and the anode causes the positively charged phosphor particles to migrate to, and deposit on, the conductive region of the surface of the LED package 1 by electrophoresis.

During the electrodeposition process, the conductive portion of the LED package 1 other than the metallic part connected to the anode also has an electrical potential due to the conductivity of the aqueous phosphor dispersion. Because of the structure of the LED chip die 2, different conductive portions of the LED package 1 tend to have different electrical potentials. The surface electrode of the LED chip die 2, the soldering material used for die bonding and the leading electrodes 4 and 5 formed on the support member 3 may contain one element selected from Ag, Pb, Cu, Sn and Ni. When two or more regions containing the same element exist on the LED package 1, a potential difference arises between these regions. This causes ion migration in the aqueous solution and, as a result, cations are dissolved in the solution. In the present exemplary embodiment, a case is described in which Ag is used in the leading electrodes 4 and 5 for ease of understanding. In this case, $Ag^+$ dissolves from the leading electrode 5, which has a higher electrical potential, into the solution.

In the present exemplary embodiment, an auxiliary cathode is arranged between the LED package 1 (serving as a cathode) and the anode to trap Ag ions dissolved in the solution by ion migration during the electrodeposition process, thereby preventing the deposition of Ag ions on the surface or electrodes of the LED chip die 2. The electrical potential of the auxiliary cathode is kept lower than the electrical potential at the surface of the LED chip die 2. This prevents the deposition of Ag on the surface of the LED chip die 2 on which to deposit the phosphor. As a result, darkening of the phosphor layer 7 on the surface of the LED chip die 2 can be prevented.

The electrodeposition process of the presently disclosed subject matter will now be described in further detail in the following first to third exemplary embodiments.

First Exemplary Embodiment

Figure 2:
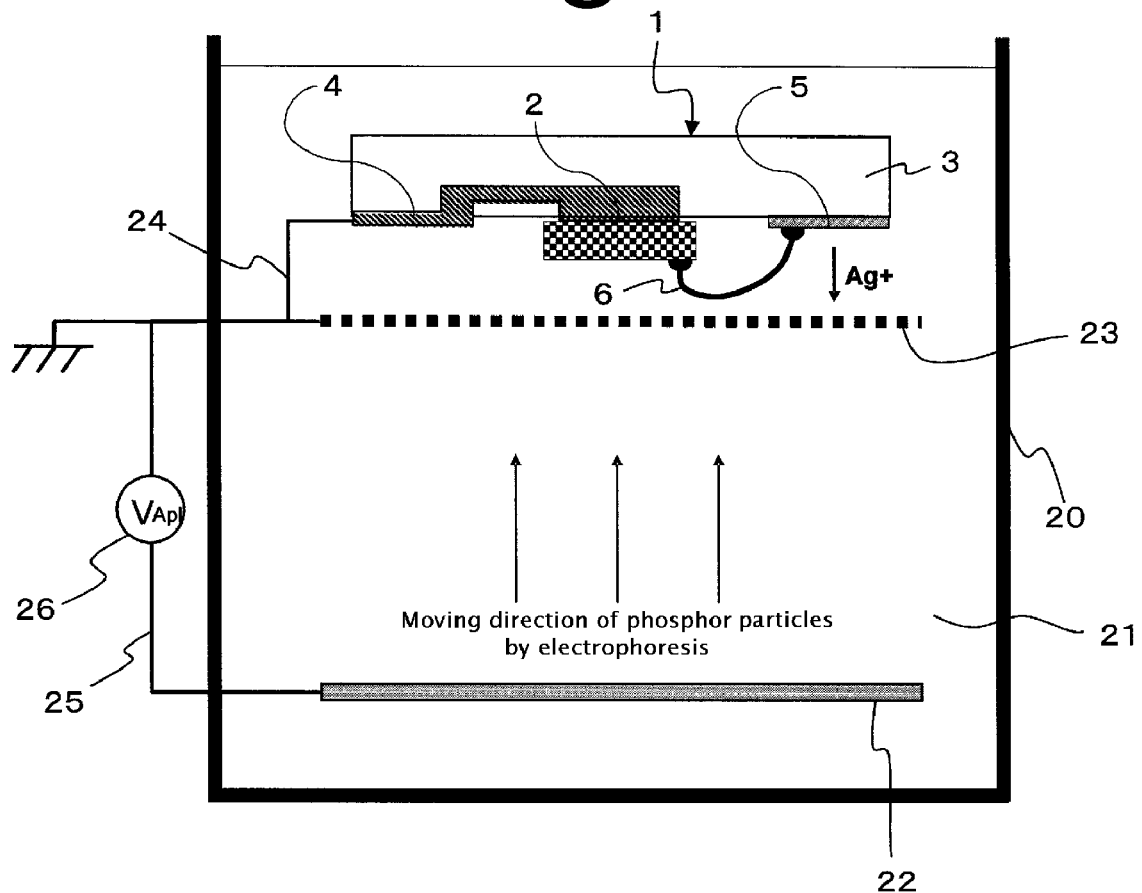
FIG. 2 is an illustrative diagram of a first exemplary embodiment of an electrodeposition apparatus used in electrodeposition and made in accordance with principles of the presently disclosed subject matter.
Figure 3:
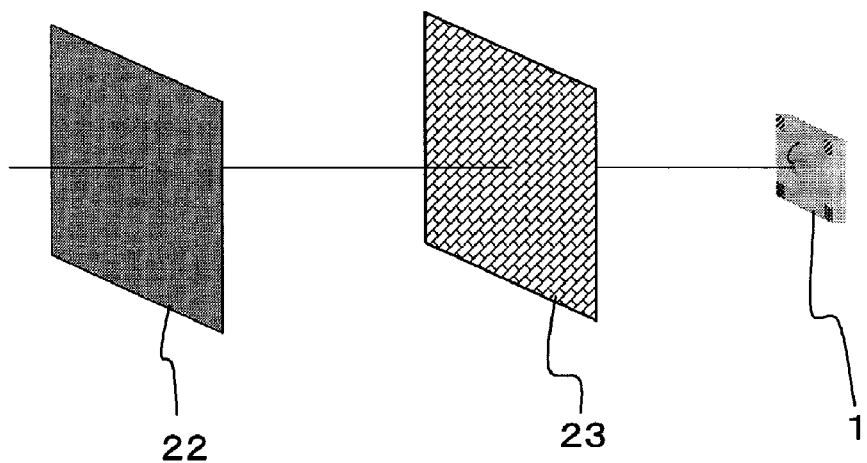
FIG. 3 is a perspective view showing an anode, an auxiliary cathode and an LED package used in the electrodeposition apparatus of FIG. 2.

Referring to FIGS. 2 and 3, an electrodeposition process using a meshed auxiliary cathode will now be described as a first exemplary embodiment.

The apparatus shown in FIG. 2 is an electrodeposition apparatus using electrophoresis. The apparatus includes a deposition tank (processing tank) 20, a solution 21 having phosphor (YAG) particles dispersed therein filling the deposition tank 20, and an anode (platinum) 22 arranged at the bottom of the tank 20. An LED package 1 serving as the cathode is arranged in the upper part of the solution 21 in such a manner as to be opposite to the anode 22. A p-type contact leading electrode 4 arranged on the LED package 1 is connected to the negative electrode of a DC power source 26 via a wire 24. The anode is connected to the positive electrode of the DC power source 26 via a wire 25.

The electrodeposition apparatus in accordance with the presently disclosed subject matter can further include an auxiliary cathode 23. The auxiliary cathode 23 is arranged between the LED package 1 serving as the cathode and the anode 22, and is used for trapping metal ions dissolving from the LED package 1 by ion migration. The auxiliary cathode 23 in the present exemplary embodiment is essentially a mesh to allow the phosphor particles present in the solution 21 to pass therethrough.

As shown in FIG. 3, the auxiliary cathode 23 has a size equal to or greater than the LED package 1 and is arranged at a distance from the LED package 1, facing the LED package 1. The distance between the auxiliary cathode 23 and the LED package 1 is such that the metal ions dissolving from the LED package 1 can reach the auxiliary cathode 23. For example, the distance is any distance smaller than the distance between the source of the dissolved metal ions (for example, the n-type contact leading electrode 5) and the region on which the ions deposit (for example, the LED chip die 2), and is desirably 2 mm or less, for example.

The auxiliary cathode 23 is connected to the negative electrode of the DC power source 26. Accordingly, the auxiliary cathode 23 has the same electrical potential as the p-type contact leading electrode 4 of the LED package 1. It should be appreciated that, since the negative electrode of the DC power source 26 in the present exemplary embodiment has the ground potential, the auxiliary cathode 23 and the p-type contact leading electrode 4 of the LED package 1 have the same ground potential. However, they don't necessarily have to have the ground potential and may have any electrical potential lower than that of the anode 22.

The mesh of the auxiliary cathode 23 is sized large enough to allow the passage of the phosphor particles present in the solution 21 (or the secondary particles formed by aggregation of the phosphor particles, when they are formed). When the size of the secondary particles of the phosphor particles is approximately 5 μm, the mesh size of the auxiliary cathode 23 can be equal to or more than 4 times the size of the secondary particles, for example.

When the mesh of the auxiliary cathode 23 is relatively fine (i.e., the distance between the adjacent conductive portions (wires) is relatively small), the total area of the conductive portions is relatively small. Such an auxiliary cathode requires a decreased electrical power during the electrodeposition process, but shows a decreased attraction to the dissolved Ag ions (i.e., decreased trap performance). Conversely, when the mesh of the auxiliary cathode is too coarse, the area of the electrode is increased. Such an auxiliary cathode not only requires an increased amount of electrical power during the electrodeposition process, but also results in an increased amount of the phosphor deposited thereon. This leads to a decrease in the efficiency of the use of the phosphor (as measured by the amount of the phosphor deposited on the LED chip die 2 divided by the total amount of the phosphor deposit). For these reasons, the size of the mesh, or the distance between the adjacent wires, is adjusted to balance the trap performance of Ag ions and the efficiency of the use of the phosphor.

It should be noted that the auxiliary cathode 23 can more effectively trap Ag ions when its conductive portions (wires) are positioned close to the source of the dissolved Ag (for example, the n-type contact leading electrode 5). Therefore, the auxiliary cathode 23 can have its meshed portion positioned relative to the LED package 1 in such a manner that the conductive portion of the auxiliary cathode 23 is opposite to the n-type contact leading electrode 5.

The auxiliary cathode 23 is formed of a conductive material that does not dissolve in the electrochemical process that takes place during the electrodeposition process. Specifically, the auxiliary cathode 23 may be made of a conductive material that does not contain Ag, Pb, Cu, Sn or Ni, each an element that has a high tendency to undergo ion migration. Examples thereof include metal materials, such as Pt and SUS, and carbon materials.

The solution 21 is prepared by dispersing phosphor particles (for example, YAG particles) and magnesium nitrate ($Mg(NO_3)_2$) serving as both a charging agent and a binder in a solvent composed mainly of isopropyl alcohol and water. For example, phosphor particles (YAG particles) and magnesium nitrate ($Mg(NO_3)_2$) may be dispersed to concentrations of 4 g/L and 5 mmol/L, respectively, to make the solution 21. The phosphor particles (primary particles) may have a size ranging from several nanometers to several tens of micrometers.

To deposit the phosphor layer 7 by the deposition apparatus shown in FIG. 2, the LED package 1 is mounted in the deposition tank 20 filled with the solution 21. Then, a predetermined voltage is applied by the power source 26. In the solution 21, magnesium nitrate is dissolved to be ionized, making the phosphor particles positively charged. Therefore, the positively charged phosphor particles are electrophoresed to migrate from the anode 22 side toward the auxiliary cathode 23 and then to the LED package 1 that serves as the cathode.

Some of the phosphor particles deposit on the auxiliary cathode 23, while some pass through the mesh of the auxiliary cathode 23 and travel to the LED package 1 where they deposit on the conductive regions of the LED package 1. In this instance, specifically, they deposit on the surface of the LED chip die 2, the p-type contact leading electrode 4, the n-type contact leading electrode 5, and the wire 6 in the LED package 1.

Subsequently, the LED package 1 is pulled out of the deposition tank 20. Then, as a post-cleaning, the phosphor particles deposited on any portions other than the surface of the LED chip die 2 are removed by wiping or blowing. This completes the color-converting light-emitting device of FIG. 1 in which the phosphor layer 7 is formed to a uniform thickness on the surface of the LED chip die 2.

Since the p-type contact leading electrode 4 is connected to the negative electrode of the power source 26, the electrical potential of the conductive portions of the LED package 1 and the auxiliary cathode 23 is maintained as follows during the electrodeposition process:

n-type contact leading electrode 5>surface of the LED chip die 2>p-type contact leading electrode 4=auxiliary cathode 23 (=ground potential).

In the present exemplary embodiment, ion migration occurs when different electrical potentials are applied to the n-type contact leading electrode 5 and the p-type contact leading electrode 4, both of which contain Ag. Specifically, $Ag^+$ dissolves from the n-type contact leading electrode 5 having a higher electrical potential by ion migration. This phenomenon will be described in detail.

(1) Ag is ionized on the side with a higher electrical potential (i.e., n-type contact leading electrode 5 with a higher electrical potential).

$$Ag \rightarrow Ag^+ + e^-$$

$$H_2O \rightarrow H^+ + OH^-$$

(2) The ionized $Ag^+$ reacts with the dissociated $OH^-$ in the solution 21 to form AgOH.

(3) Though unstable, AgOH tends to deposit as silver oxide, and undergoes reversible reactions in the presence of moisture and electric field, and both materials co-exist. $Ag_2O$ and AgOH are electrically neutral and can diffuse in the solution.

$$Ag_2O + H_2O \leftarrow\rightarrow 2AgOH \leftarrow\rightarrow 2Ag^+ + 2OH^-$$

(4) Coulomb's force causes $Ag^+$ to migrate to the lower potential side where it deposits as Ag.

$$Ag^+ + e^- \rightarrow Ag$$

In the present exemplary embodiment, the auxiliary cathode 23 has the same low electrical potential (ground potential) as the p-type contact leading electrode 4 so that the dissolved Ag ions will deposit on the auxiliary cathode 23 as Ag. Accordingly, Ag which is unnecessary and undesirable for the phosphor layer can be trapped on the auxiliary cathode 23. Namely, this prevents the deposition of Ag on the surface of the LED chip die 2 on which phosphor is intended to be deposited. As a result, darkening of the phosphor layer 7 on the surface of the LED chip die 2 can be prevented.

While the auxiliary cathode 23 used in present exemplary embodiment is a mesh, it may be a punched conductive metal plate with a number of spaced-apart holes punched through it, or a conductive lattice with a number of spaced-apart slits formed in it, or other structure.

Second Exemplary Embodiment

Figure 4:
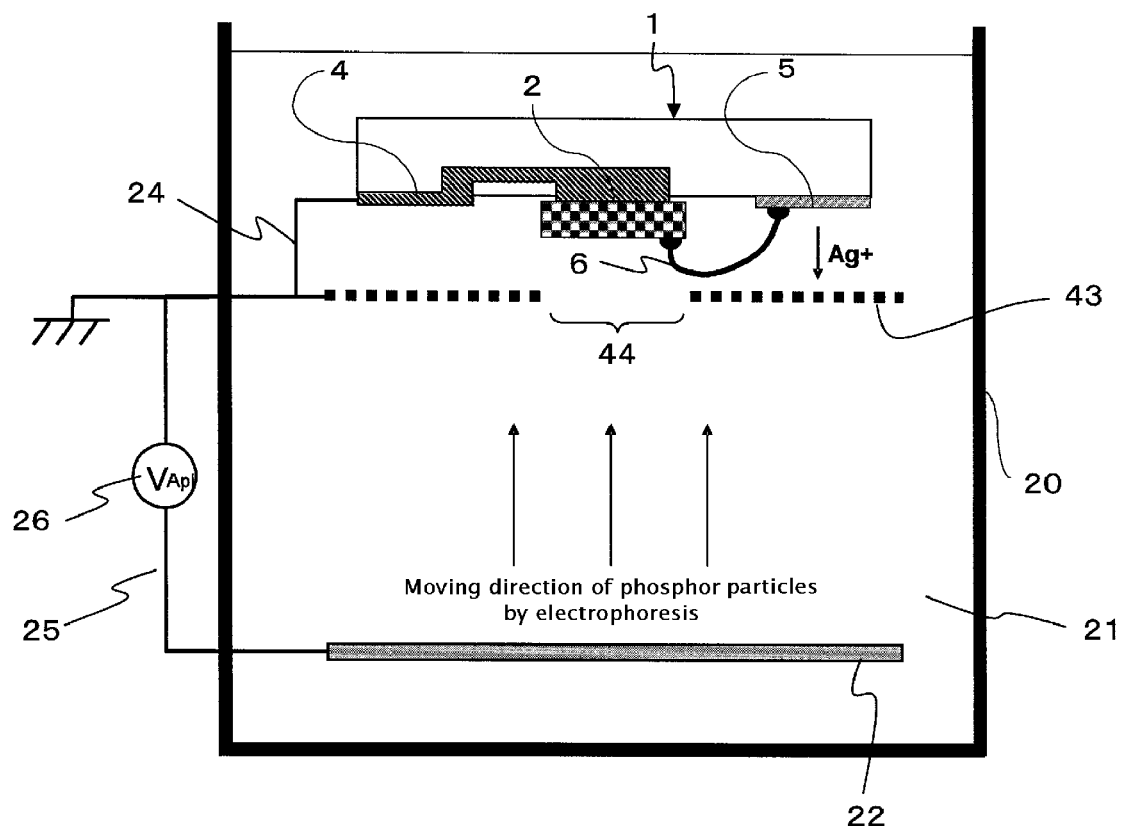
FIG. 4 is an illustrative diagram showing a second exemplary embodiment of an electrodeposition apparatus used in electrodeposition and made in accordance with principles of the presently disclosed subject matter.
Figure 5:
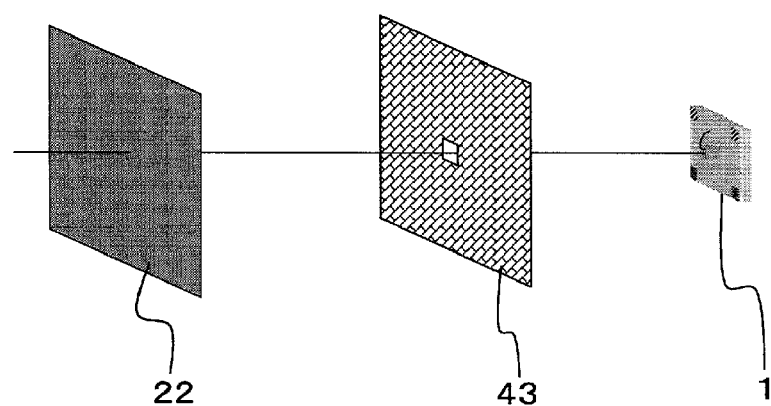
FIG. 5 is a perspective view showing the anode, the auxiliary cathode and the LED package used in the electrodeposition apparatus of FIG. 4.

Referring now to FIGS. 4 and 5, an electrodeposition process using another meshed auxiliary cathode will be described as a second exemplary embodiment.

FIG. 4 shows an electrodeposition apparatus used in the second exemplary embodiment. The apparatus of FIG. 4 has essentially the same or similar structure as the apparatus shown in FIG. 2, except for the shape of the auxiliary cathode 43. Since the other elements can be the same as those of the apparatus of FIG. 2, the same description will not be repeated here.

As shown in FIG. 5, the auxiliary cathode 43 in the second exemplary embodiment has a meshed structure having a window 44 formed at the center thereof. The window 44 has the same or substantially the same size as the LED chip die 2. As in the first exemplary embodiment, the auxiliary cathode 43 as shown in FIG. 5 is positioned relative to the LED package 1 so that the window 44 corresponds to the LED chip die 2.

The material and the size of mesh of the auxiliary cathode 43, as well as the distance between the auxiliary cathode 43 and the LED package 1, can be the same as in the first exemplary embodiment, as can be the process of electrodeposition.

In the second exemplary embodiment, the window 44 formed in the auxiliary cathode 43 at a position corresponding to the LED chip die 2 allows the passage of the phosphor particles in the solution, thus facilitating the deposition of the phosphor particles on the surface of the LED chip die 2 during the electrodeposition process. Accordingly, the amount of the phosphor deposited on the auxiliary cathode 43 can be reduced as compared to the auxiliary cathode 23 in the first exemplary embodiment and the efficiency of the use of the phosphor can be increased. This facilitates the production of the color-converting light-emitting device of FIG. 1. Another advantage of the second exemplary embodiment is that the electrodeposition process requires a decreased electrical power since the total area of the conductive portions of the auxiliary cathode 43 is smaller than that of the auxiliary cathode 23 of the first exemplary embodiment shown in FIG. 2.

Third Exemplary Embodiment

Figure 6:
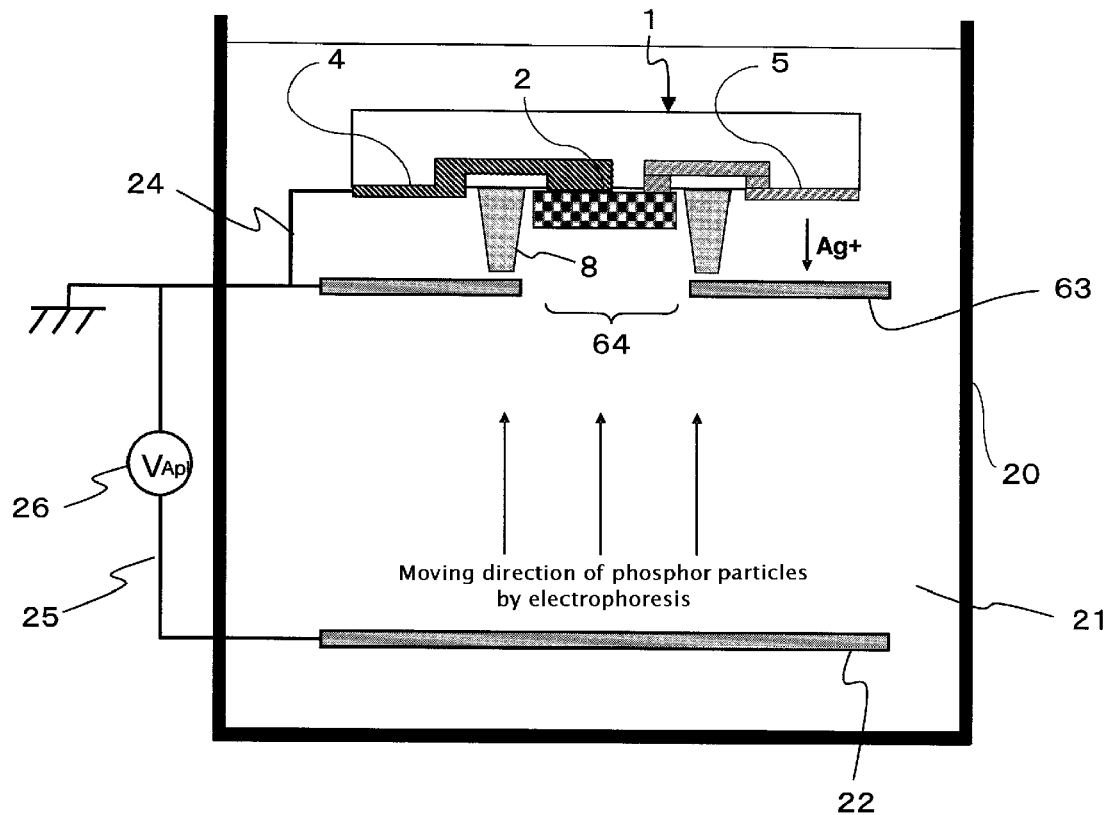
FIG. 6 is an illustrative diagram showing a third exemplary embodiment of an electrodeposition apparatus used in electrodeposition and made in accordance with principles of the presently disclosed subject matter.
Figure 7:
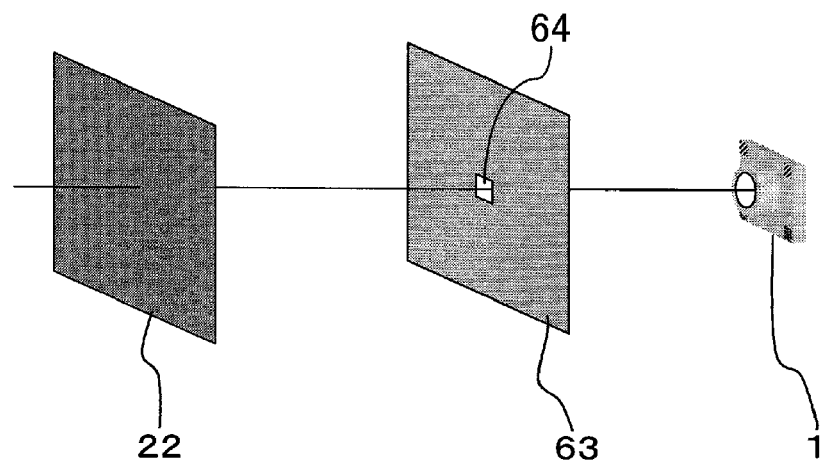
FIG. 7 is a perspective view showing the anode, the auxiliary cathode and the LED package used in the electrodeposition apparatus of FIG. 6.

Referring now to FIGS. 6 and 7, an electrodeposition process using a plate-like auxiliary cathode having a window will be described as a third exemplary embodiment.

FIG. 6 shows an electrodeposition apparatus used in the third exemplary embodiment. The apparatus of FIG. 6 can have essentially the same or similar structure as compared to that of the first exemplary embodiment shown in FIG. 2, except for the respective shapes of the LED package 1 and the auxiliary cathode 63. Since the other structural elements can be the same as those of the apparatus of FIG. 2, the same description will not be repeated here.

As shown in FIGS. 6 and 7, the auxiliary cathode 63 in the third exemplary embodiment is a plate having a window 64 formed at the center thereof. The window 64 can have the same or substantially same size as the LED chip die 2. The auxiliary cathode 63 is positioned relative to the LED package 1 so that the window 64 corresponds to the LED chip die 2, as in the first and second exemplary embodiments.

As shown in FIG. 6, the LED package 1 in the third exemplary embodiment includes a reflector ring 8 that surrounds the LED chip die 2. The reflector ring 8 serves to reflect the light emitted from the LED chip die 2 upward from the LED chip die 2. It is arranged to encircle the LED chip die 2. The reflector ring 8 enables the LED package 1 to emit light with high directivity upward along a direction normal to the plane of the LED package 1. The reflector ring 8 can include on its inner wall an Ag layer to enhance the reflectance. Although the Ag layer is not electrically connected to any of the electrodes 4, 5 of the support member 3 and the LED chip die 2, it is electrically connected to these elements via the solution and can thus cause ion migration. In the present exemplary embodiment, however, Ag ions dissolving from the reflector ring 8 by ion migration, if any, can be trapped by the auxiliary cathode 63.

The material of the auxiliary cathode 63, as well as the distance between the auxiliary cathode 63 and the LED package 1, can be substantially the same as in the first exemplary embodiment. The process of electrodeposition can also be the same or similar to that described with respect to the first exemplary embodiment.

In the third exemplary embodiment, the window 64 formed in the auxiliary cathode 63 at a position corresponding to the LED chip die 2 allows the phosphor particles in the solution to pass through it and deposit on the surface of the LED chip die 2 during electrodeposition, whereas the plate-like portion about the window 64 does not allow the passage of the phosphor particles. Thus, the auxiliary cathode 63 serves as a mask that allows formation of the phosphor layer 7 substantially only on the surface of the LED chip die 2, and not substantially on any undesirable regions, including the surface of the reflector ring 8. This eliminates the need to remove the phosphor layer that might be deposited on parts other than the LED chip die 2, as in the first exemplary embodiment.

In addition, the plate-like auxiliary cathode 63 arranged adjacent to the n-type contact leading electrode 5 can attract and trap the Ag ions dissolved in the solution more effectively than the meshed electrode.

Although the auxiliary cathode 63 in the third exemplary embodiment is used with the LED package 1 having the reflector ring 8 mounted thereon, the auxiliary cathode 63 may also be used with an LED package 1 that does not include the reflector ring 8 like the one shown in FIG. 2 to trap Ag ions. When the LED package 1 does not include the reflector ring 8, the above-described masking effect becomes less significant since the phosphor particles can diffuse into the periphery of the window 64 of the auxiliary cathode 63. The resulting unwanted phosphor deposits can be removed in a later process as in the first exemplary embodiment, however, to make the LED package 1 having the structure shown in FIG. 1.

As described in the first to third exemplary embodiments, the auxiliary cathode 23, 43, or 63 is used in the presently disclosed subject matter to trap Ag ions. This construction prevents the deposition of Ag particles on the phosphor layer 7 on the LED chip die 2, which are smaller in size than the visible wavelength and are responsible for the formation of light-absorbing spots. It also prevents electrical short circuits caused by the deposition of Ag on the electrode pattern portion. Thus, a highly luminous, electrically reliable color-converting light-emitting device can be produced by the electrodeposition processes described in the first to third exemplary embodiments since the light emitted from the LED chip die 2 and the phosphor is not absorbed by Ag.

Like Ag, cations of other elements that have a high tendency to undergo ion migration, such as Pb, Cu, Sn, and Ni, are attracted to, and trapped by, the low potential auxiliary cathode when they dissolve in the solution. Ion migration is caused not only by the described combination of the leading electrodes 4 and 5, but also by any combination of two or more metallic regions containing the same element selected from Ag, Pb, Cu, Sn, and Ni, etc. Therefore, the ions of such elements can also be trapped by the auxiliary cathode in accordance with the presently disclosed subject matter.

Other metallic regions that can cause ion migration include electrodes of the LED chip, conductive layers formed on the surface of the LED chip, metal layers formed within the LED chip, wires and reflectors formed on the support member, adhesive materials used to join the LED chip and the support member, and reflective walls formed on the support member, although the types of the metallic region depend on the construction of the LED chip and LED package. For example, Ag, Ni, and Cu may be used to form the foundation or one layer of the multilayered structure and Sn and Pb may be used as a soldering material. The metallic regions containing Ag, Pb, Cu, Sn, or Ni are not only used in the outermost layer of the LED package, but can also be used to form the foundation layer or one layer of the multilayered structure (not the outermost layer). Even in such a case, ion migration from intermediate layers may be caused due to the presence of pinholes. While ion migration occurs in different patterns depending on the construction of the LED package, the electrodeposition process of the present exemplary embodiments can prevent the deposition of elements that have a high tendency to undergo ion migration, such as Pb, Cu, Sn, and Ni, etc., on the LED package.

Example

One example of the presently disclosed subject matter will now be described. In this example, the electrodeposition process described in the third exemplary embodiment is used with the electrodeposition apparatus of FIG. 6 to form a phosphor layer 7 on the top surface of the LED chip die 2 in the LED package 1.

The distance between the LED package 1 and the auxiliary cathode 63 was 1 mm. The solution 21 was prepared by dispersing phosphor particles (YAG) and magnesium nitrate ($Mg(NO_3)_2$) to concentrations of 4 g/L and 5 mmol/L, respectively, in a solvent mainly composed of isopropyl alcohol and water. An electric field of 200 V/20 mm was applied between the anode 22 and the cathode (LED package 1) (FIG. 6). Electrodeposition was carried out in a time period of 15 minutes to deposit a phosphor layer 7 having a thickness of approximately 30 μm.

As a comparative example, a phosphor layer was deposited in the same manner as in the above described example, except that the auxiliary cathode 63 was not provided.

Figure 8A:
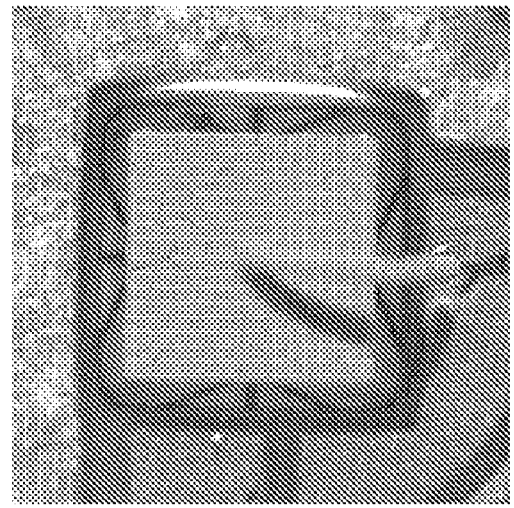
FIG. 8A is a photograph of an LED chip die used in an LED package of example with a phosphor layer deposited by electrodeposition.
Figure 8B:
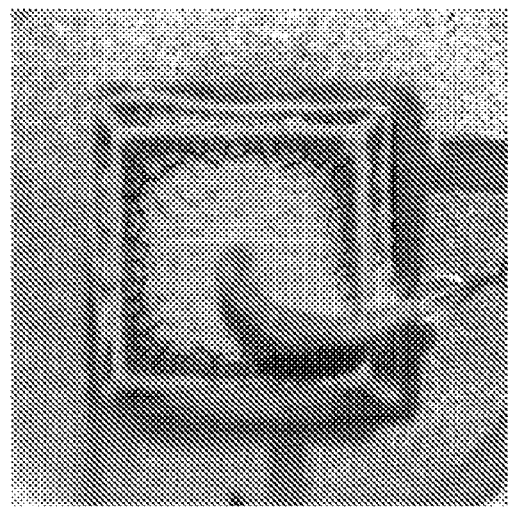
FIG. 8B is a photograph of an LED chip die used in an LED package of a comparative example with a phosphor layer deposited by electrodeposition without using an auxiliary cathode.

The photographs in FIGS. 8A and 8B show the LED chip dies 2 of the LED packages 1 of the example and the comparative example, respectively. As can be clearly seen from FIG. 8A, the phosphor layer 7 was yellow (the color of phosphor particles) and was not darkened in the LED package 1 of the example. In comparison, the phosphor layer was darkened (to brown) in the LED package of the comparative example in FIG. 8B. The darkening was particularly significant at the corners of the chip where the electric field concentrates.

In order to identify the dark material in the darkened deposit of the LED package of the comparative example, electrodeposition was performed using a phosphor-free solution and without the auxiliary cathode 63, to make a sample LED package. The used solution was the same as the solution 21 used in the example and the comparative example, except that it did not contain phosphor particles. Specifically, it was prepared by dissolving magnesium nitrate ($Mg(NO_3)_2$) to a concentration of 5 mmol/L in a solvent mainly composed of isopropyl alcohol and water. Electrodeposition was performed using the apparatus of FIG. 6 without providing the auxiliary cathode 63.

A layer of a deposit was formed on the surface of the resulting LED package 1. The layer was darkened, primarily at the corners of the chip where the electrical field concentrates. The darkened deposit and the undarkened deposit were analyzed by X-ray photoelectron spectroscopy (XPS). The results are shown in FIGS. 9A and 9B.

Figure 9A:
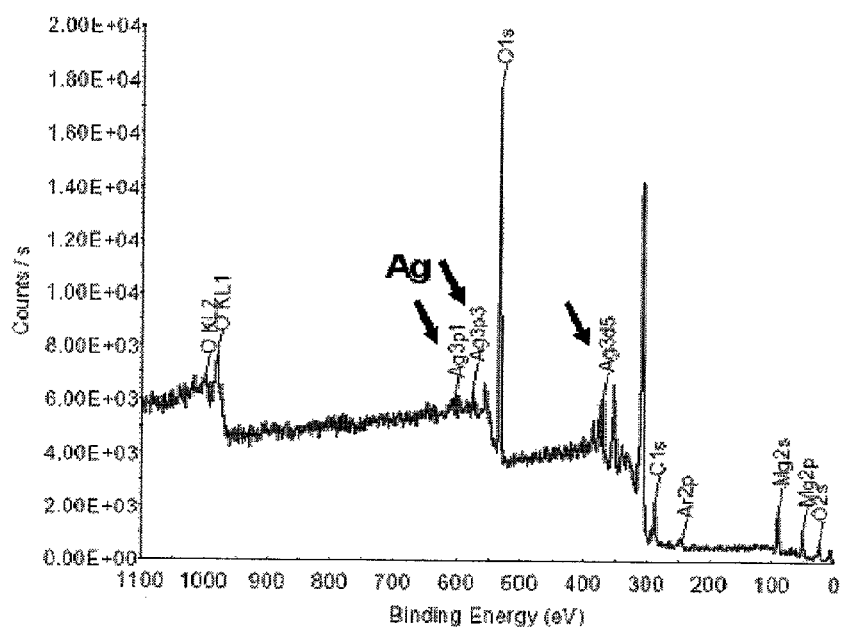
FIG. 9A is a graph showing the results of XPS analysis of a darkened part of a sample deposited by electrodeposition using a phosphor-free solution and FIG. 9B is a graph showing the results of XPS analysis of an undarkened part of the same sample.
Figure 9B:
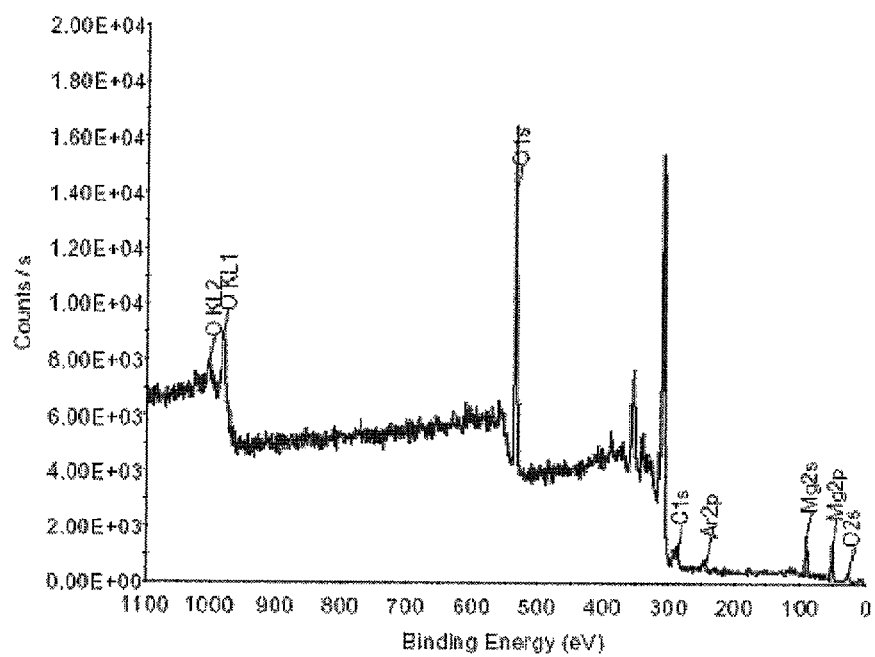

According to a comparison between the graphs of FIGS. 9A and 9B, Mg compounds including $Mg(OH)_2$, MgO and $MgCO_3$ are common to both of the darkened and undarkened deposits whereas Ag element is detected only in the darkened deposit as indicated by arrows in FIG. 9A. This indicates that the darkening of the deposit is caused by Ag that has migrated and deposited by ion migration. Because the samples were prepared using phosphor-free solutions, it is assumed that the compounds detected as shown in the graphs of FIGS. 9A and 9B, including Ag and Mg compounds, do not originate from the phosphor particles.

Collectively, the results indicate that the darkening occurring in the LED package of the comparative example (FIG. 8B), which does not include the auxiliary cathode 63, is caused by Ag that has migrated and deposited by ion migration.

Accordingly, it has been shown that, during the electrodeposition process of the example, the auxiliary cathode 63 serves to trap Ag dissolved by ion migration, which otherwise would deposit on the LED package 1 and cause darkening. Thus, a highly luminous, electrically reliable color-converting light-emitting device can be produced by the electrodeposition process described in the example since the deposition of metal or other elements on the phosphor layer and between the electrodes can be prevented during the electrophoresis for depositing the phosphor layer.

Next, a description will be given of some exemplary embodiments in accordance with other aspects of the presently disclosed subject matter with reference to FIGS. 10 to 15. Note that the following exemplary embodiments can also employ the LED package 1 used in the first to third exemplary embodiments described above (see FIG. 1).

The LED package 1 of FIG. 1 includes a plurality of metallic parts including leading electrodes 4 and 5, surface electrodes of the LED chip 2, soldering materials used for die-bonding, and the like. Accordingly, when the LED package 1 of FIG. 1 is used in the electrophoresis process to serve as a cathode, metallic part(s) other than those directly connected to the power source can also have an electrical potential due to the conductivity of the solution. Due to the structure of the LED chip die 2, different metallic parts of the LED package 1 tend to have different electrical potentials. For example, when the p-type contact leading electrode is directly connected to the negative electrode of the power source, the electrical potential of the metallic parts of the LED package 1 can be maintained as follows during electrodeposition: n-type contact leading electrode 5≧soldering material for die-bonding>surface of the LED chip die 2>p-type contact leading electrode 4.

These metallic parts may contain at least one element selected from Ag, Pb, Cu, Sn, and Ni, etc. When two or more regions containing the same element among these exist, a potential difference arises between these regions. This causes ion migration in the aqueous solution and, as a result, cations are dissolved in the solution.

In the present exemplary embodiment, a plurality of metallic parts of the LED package 1 are connected to each other or to an electrode having a ground potential in advance to allow these metallic parts to have the same electrical potential in the solution during electrodeposition. Accordingly, even if these metallic parts having the same electrical potential include the same element from among Ag, Pb, Cu, Sn, and Ni, etc., ion migration does not occur. In this manner, the deposition of certain element(s) on the phosphor layer formed on the surface of the LED chip die 2 can be prevented, which otherwise could becomes light-absorbing spots. The configuration as described above also prevents electrical short circuit(s) or the decrease in electrical reliability due to deposition on electrodes. It should be noted that the connection between these metallic parts is temporal during electrodeposition, and after the process, it is cut or removed.

In the present exemplary embodiment, phosphor particles may be electrophoresed to deposit on the entire surface including the connected metallic parts. Therefore, as in the third exemplary embodiment described above, an auxiliary cathode having a window may be provided in the present exemplary embodiment to allow the phosphor particles to selectively deposit on the surface of the LED chip 2.

The electrodeposition process of the presently disclosed subject matter will now be described in further detail with regard to the following fourth to seventh exemplary embodiments.

Fourth Exemplary Embodiment

A fourth exemplary embodiment will now be described with reference to FIGS. 10 and 11. In this configuration, the LED package 1, whose leading electrodes 4 and 5 can contain any element which has a high tendency to undergo ion migration, is subjected to electrodeposition for forming a light-converting material layer, or a phosphor layer.

Figure 10:
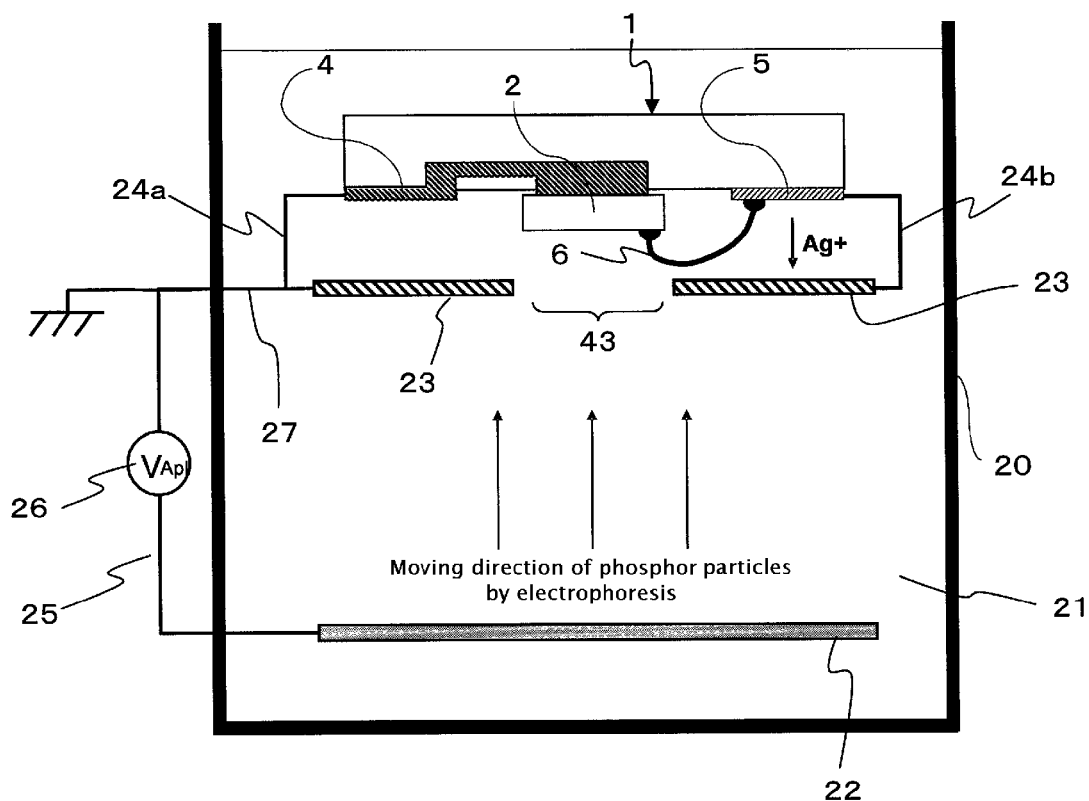
FIG. 10 is an illustrative diagram of a fourth exemplary embodiment of an electrodeposition apparatus used in electrodeposition and made in accordance with principles of the presently disclosed subject matter.
Figure 11:
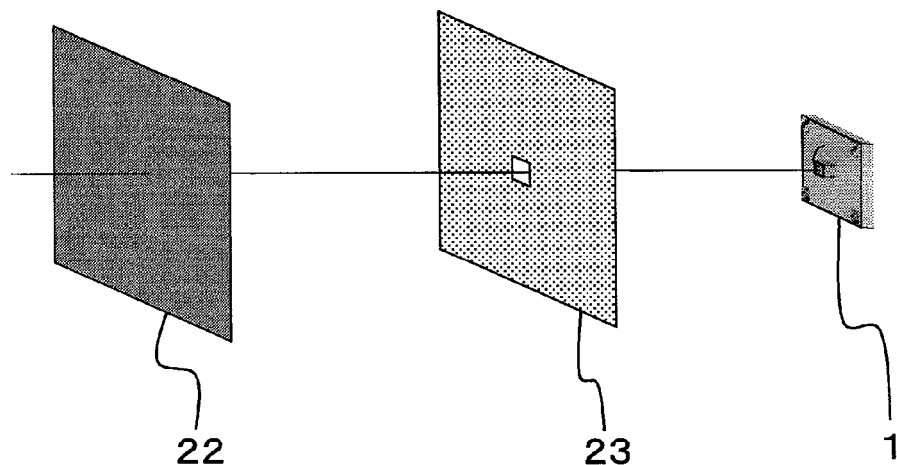
FIG. 11 is a perspective view showing the positional relationship between the anode, the auxiliary cathode and the LED package used in the electrodeposition apparatus of FIG. 10.

The apparatus shown in FIG. 10 is an electrodeposition apparatus configured for using electrophoresis, and which can have the same structure as that shown in FIG. 2, except for the auxiliary cathode 23 and the leading electrodes 4 and 5 being connected to a ground potential. Since the other elements can be the same or substantially the same as those of the apparatus of FIG. 2, the same description will not be repeated here.

In the present exemplary embodiment, the p-type contact leading electrode 4 of the LED package 1 is connected to a negative electrode (or a ground potential) of the DC power source 26 via a wire 24a, and the n-type contact leading electrode 5 is connected to the auxiliary cathode 23 via a wire 24b. The auxiliary cathode 23 is connected to the negative electrode of the power source 26 via a wire 27. Accordingly, the leading electrodes 4 and 5 and the auxiliary cathode 23 each have a ground potential. The anode 22 is connected to a positive electrode of the DC power source 26 via a wire 25.

The distance between the auxiliary cathode 23 and the LED package 1 is set so as to allow the phosphor particles to pass through the window 43 of the auxiliary cathode 23 and selectively deposit on the surface of the LED chip die 2, and the distance can be 2 mm or less, for example.

After electrodeposition, the wires 24a, 24b, and other wires are removed or cut before the LED package 1 is removed from the deposition tank 20. Furthermore, as for post-cleaning, if phosphor particles diffuse and deposit on any portions other than the surface of the LED chip die 2 outside the window 43, the phosphor particles are removed by wiping or blowing. This completes the color-converting light-emitting device in which the phosphor layer 7 is formed to a uniform thickness on the surface of the LED chip die 2.

Since the leading electrodes 4 and 5 formed on the LED package 1 are connected to the negative electrode of the power source 26 or the auxiliary cathode 23, the electrical potential of these is the same as each other (for example, ground potential). Accordingly, even if the leading electrodes 4 and 5 contain the same element (for example, Ag) selected from Ag, Pb, Cu, Sn, and Ni, etc., which has a high tendency to undergo ion migration, ion migration can be prevented. Namely, this prevents the deposition of Ag fine particles on the surface of the LED chip die 2 onto which phosphor is intended to be deposited. As a result, darkening of the phosphor layer 7 on the surface of the LED chip die 2 can be prevented.

Furthermore, since the leading electrodes 4 and 5 can each have a ground potential, the phosphor particles can be attracted to these electrodes 4 and 5 by electrophoresis. In the present exemplary embodiment, however, the auxiliary cathode 23 is disposed to cover the leading electrodes 4 and 5, and thus the auxiliary cathode 23 serves as a mask to allow the phosphor particles to selectively deposit on the surface of the LED chip 2.

In the present exemplary embodiment, as shown in FIG. 10, the LED package 1 and the anode 22 are disposed to face to each other. The presently disclosed subject matter is not limited thereto, and the main surface of the LED chip die 2 or the package 1 can be disposed perpendicularly to the anode 22, or the LED package 1 can be rotated with respect to the anode 22 so as to reduce the variation in thickness of the deposited phosphor layer 7.

Fifth Exemplary Embodiment

As a fifth exemplary embodiment, the LED package 1 in the third exemplary embodiment can further include a reflector ring that contains an element or material which has a high tendency to undergo ion migration, as does the leading electrodes 4 and 5. A description of the electrodeposition process therefore will now be described with reference to FIG. 12.

Figure 12:
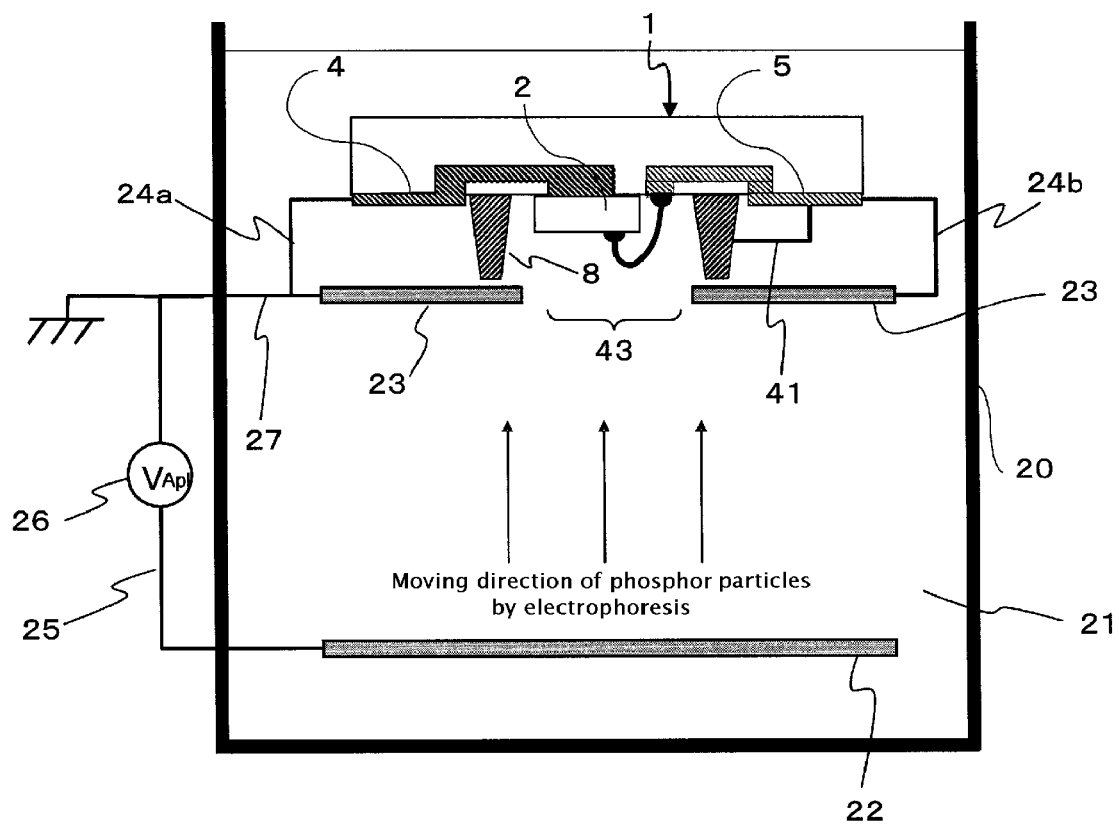
FIG. 12 is an illustrative diagram of a fifth exemplary embodiment of an electrodeposition apparatus used in electrodeposition.

As shown in FIG. 12, the LED package 1 includes a reflector ring 8 that surrounds the LED chip die 2. The reflector ring 8 can include on its inner wall a metallic layer to enhance the reflectance. Although the metallic layer is not electrically connected to any of the electrodes 4 and 5 of the support member 3 and the LED chip die 2, it is electrically connected to these elements via the solution. Accordingly, if the metallic layer of the reflector ring 8 contains an element or material (for example, Ag) which has a high tendency to undergo ion migration, selected from Ag, Pb, Cu, Sn, and Ni, etc., the metallic layer may become a source for ions. In the present exemplary embodiment, as shown in FIG. 12, the Ag metallic layer of the reflector ring 8 is connected to the n-type contact leading electrode 5 via a wire 41. The leading electrode 5 is connected to the auxiliary cathode 23 via the wire 24b as in the fourth exemplary embodiment. The leading electrode 4 and the auxiliary cathode 23 are connected to the negative electrode of the power source 26 via the wires 24a and 27, respectively, as in the fourth exemplary embodiment.

By doing so, the metallic layer of the reflector ring 8 and the leading electrodes 4 and 5 as well as the auxiliary cathode 23 are set to have the same potential, for example, a ground potential. Namely, since the leading electrodes 4 and 5 and the metallic layer of the reflector ring 8 are allowed to have the same electrical potential, even when they contain an element or material which has a high tendency to undergo ion migration, ion migration can be prevented.

It should be appreciated that the other construction and operations can be the same as in the fourth exemplary embodiment, and the phosphor particles can pass through the window 43 of the auxiliary cathode 23 and deposit on the surface of the LED chip die 2 of the LED package 1.

It should be noted that the connection(s) of the leading electrodes 4 and 5, the reflector ring 8, and the auxiliary cathode 23 are not limited to the way shown in FIG. 12 and can be achieved by various other means as long as the connection(s) result in the same or similar electrical potential. In a modification of the exemplary embodiment, the reflector ring 8 may be connected directly to the auxiliary cathode 23 or the p-type contact leading electrode 4. Furthermore, the reflector ring 8 and the n-type contact leading electrode 5 can be separately connected to the auxiliary cathode 23.

Sixth Exemplary Embodiment

Figure 13:
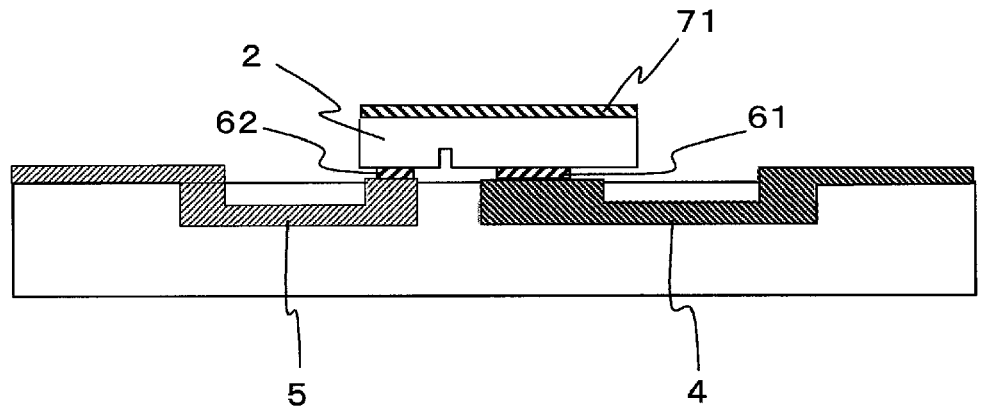
FIG. 13 is a cross-sectional view of a sixth exemplary embodiment of a light-emitting device made in accordance with principles of the presently disclosed subject matter.
Figure 14:
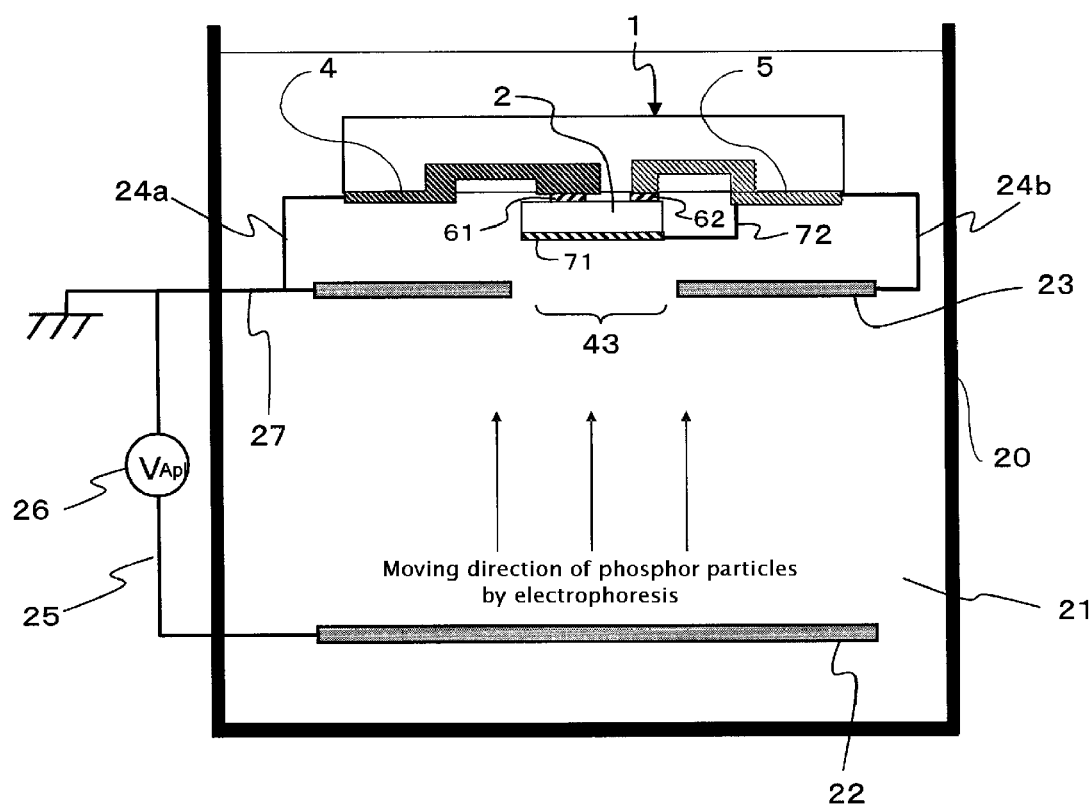
FIG. 14 is an illustrative diagram of a sixth exemplary embodiment of an electrodeposition apparatus used in electrodeposition and made in accordance with principles of the presently disclosed subject matter.

In the sixth exemplary embodiment, the LED chip die 2 of the LED package 1 can include an n-type electrode and a p-type electrode formed on the lower side of the chip die 2 as shown in FIG. 13. The p-type electrode and the n-type electrode, as shown in FIG. 14, are electrically and mechanically connected to the p-type contact leading electrode 4 and the n-type contact leading electrode 5 via the respective contact electrodes 61 and 62, respectively.

If the material forming the surface of the LED chip die 2 is non-conductive (for example, being a sapphire substrate), a conductive layer 71 may be provided to impart conductivity as a cathode for electrophoresis.

In this case, the contact electrodes 61 and 62 and the conductive layer 71 may contain an element or material which has a high tendency to undergo ion migration. Specifically, in this example, the contact electrodes 61 and 62 are made of an Au—Sn compound, and the conductive layer 71 is made of antimony oxide-tin compound containing Sn. The conductive layer 71 can be formed by coating or spraying with a suspension containing particles of the antimony oxide-tin compound.

A description will be given of electrodeposition in accordance with the sixth exemplary embodiment with reference to FIG. 14. The electrodeposition apparatus of the present exemplary embodiment can have the same structure as that used in the fourth or fifth exemplary embodiments, as shown in FIG. 14, except for the connection of the electrodes and other parts of the LED chip die 2. Specifically, the conductive layer 71 on the surface of the LED chip die 2 is connected to the n-type contact leading electrode 5 via a wire 72. The n-type contact leading electrode 5 is connected to the auxiliary cathode 23 via a wire 24b. The p-type contact leading electrode 4 and the auxiliary cathode 23 are connected to a negative electrode of the power source 26 via a wire 24a and a wire 27, respectively.

By doing so, the leading electrodes 4 and 5 and the conductive layer 71 as well as the auxiliary cathode 23 are set to have the same potential, e.g., a ground potential. Namely, since the leading electrodes 4 and 5 and the conductive layer 71 are allowed to have the same electrical potential, even when they contain a material or element which has a high tendency to undergo ion migration, ion migration can be prevented.

It should be appreciated that other construction(s) and operation(s) can be the same or similar to those in the fourth exemplary embodiment, and the phosphor particles can pass through the window 43 of the auxiliary cathode 23 and deposit on the surface of the conductive layer 71 of the LED chip die 2.

It should be noted that the connection of the leading electrodes 4 and 5 and the conductor layer 71 is not limited to the way shown in FIG. 14 and can be achieved by various other means as long as the connection result in a connection having the same electrical potential. In a modification of the exemplary embodiment, the conductive layer 71 may be connected to the p-type contact leading electrode 4.

Seventh Exemplary Embodiment

The LED package 1 of the seventh exemplary embodiment can have the same or similar configuration as that in the sixth exemplary embodiment except for having a reflector ring 9 (see FIG. 15) with the same configuration as that in the fifth exemplary embodiment.

The contact electrodes 61 and 62, the conductive layer 71, and the metallic layer of the reflector ring 9 can each contain an element or material which has a high tendency to undergo ion migration. Specifically, the contact electrodes 61 and 62 can be made of an Au—Sn compound, and the conductive layer 71 can be made of antimony oxide-tin compound containing Sn. The metallic layer of the reflector ring 9 can be an Ag layer.

Figure 15:
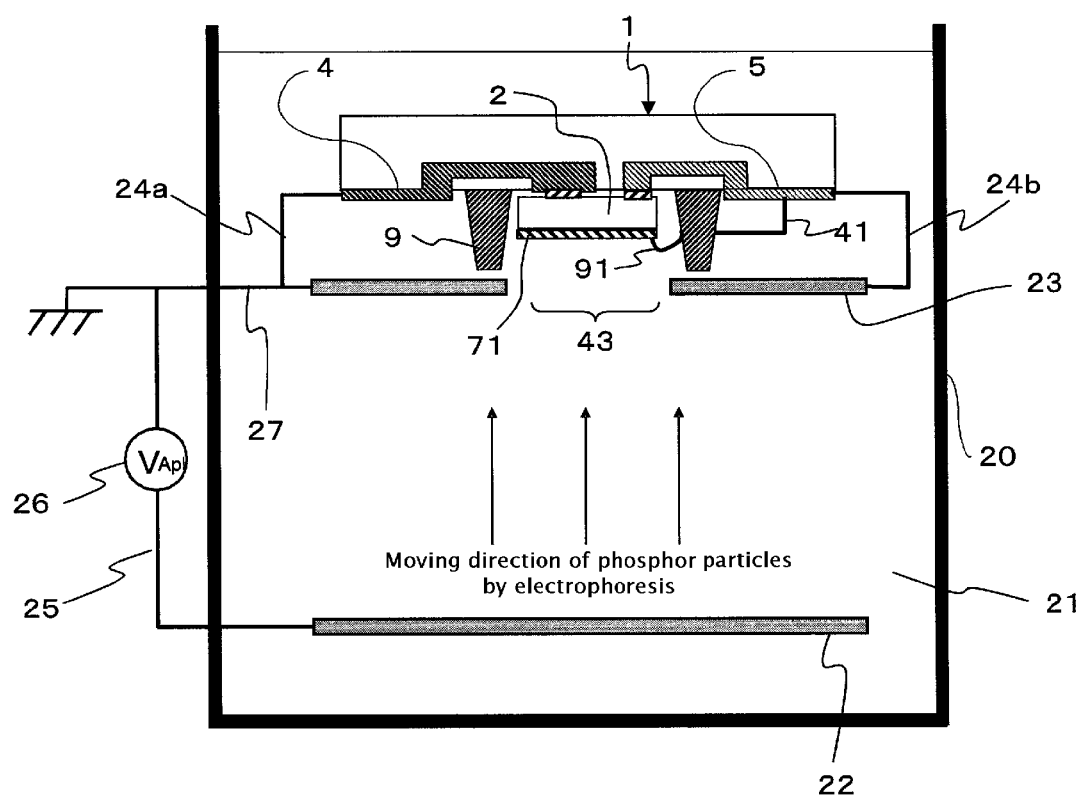
FIG. 15 is an illustrative diagram of a seventh exemplary embodiment of an electrodeposition apparatus used in electrodeposition and made in accordance with principles of the presently disclosed subject matter.

In the electrodeposition process of the seventh exemplary embodiment shown in FIG. 15, the conductive layer 71 on the surface of the chip die 2 can be connected to the metallic layer of the reflector ring 9 via a wire 91. The metallic layer of the reflector ring 9 is connected to the n-type contact leading electrode 5 via a wire 41. The n-type contact leading electrode 5 is connected to the auxiliary cathode 23 via a wire 24b. The p-type contact leading electrode 4 and the auxiliary cathode 23 are connected to a negative electrode of the power source 26 via a wire 24a and a wire 27, respectively.

By doing so, the leading electrodes 4 and 5, the conductive layer 71 and the reflector ring 9 as well as the auxiliary cathode 23 are set to have the same potential, e.g., a ground potential. Accordingly, even when they contain a material or an element which has a high tendency to undergo ion migration, ion migration can be prevented. It should be appreciated that the other construction(s) and operation(s) can be the same as in the fourth exemplary embodiment, and the phosphor particles can pass through the window 43 of the auxiliary cathode 23 and deposit on the surface of the conductive layer 71 of the LED chip die 2.

It should be noted that the connection of the leading electrodes 4 and 5 and the conductor layer 71 is not limited to the way shown in FIG. 15 and can be achieved by various other means as long as the connection results in a connection having the same electrical potential.

As described above, in accordance with the fourth to seventh exemplary embodiments, even when a plurality of metallic portions of an LED package each contain a material or element which has a high tendency to undergo ion migration, ion migration can be prevented by temporally connecting the plurality of metallic portions during electrodeposition to allow these portions to have the same or similar electrical potential. Thus, a highly luminous, electrically reliable color-converting light-emitting device can be produced since the deposition of elements on the phosphor layer and between the electrodes can be prevented during the electrophoresis process for depositing the phosphor layer. Furthermore, a phosphor layer can be formed at a region by use of the auxiliary cathode having a window.

In the electrodeposition process of the present exemplary embodiments a phosphor layer can be formed by setting a single LED package 1 having an LED chip 2 in the deposition tank 20. However, the presently disclosed subject matter is not limited to this. In a modification, a plurality of LED packages (which may be connected to each other) can be set in the deposition tank in order to simultaneously form a phosphor layer.

If a plurality of connected LED packages are set in the deposition tank, these LED packages can be separated after the formation of the phosphor layer. In this case, if the adjacent LED packages have connected leading electrodes, the electrophoresis can be performed using the already connected leading electrodes. If the leading electrode pattern on the support member is designed so that the adjacent LED packages are cut between the leading electrodes, the connection of the metallic portions can be cut during separation of the LED packages.

In the exemplary embodiments described above, the leading electrodes and the reflector member are connected via a conductor wire. However, the presently disclosed subject matter is not limited thereto. In a modification of the exemplary embodiments, a plated pattern may be formed on a support member to be continued from the leading electrodes and a reflector member may be mounted on the pattern, thereby connecting the leading electrodes and (the conductive portion of) the reflector member. After the electrodeposition of the phosphor layer, the plated pattern can be removed by the irradiation of laser beam to cut the connection.

In the above-described exemplary embodiments, the phosphor material is allowed to selectively deposit on the LED chip 2 using the auxiliary cathode 23 to form the phosphor layer. However, the phosphor material can be allowed to deposit without the auxiliary cathode 23. In this case, the plurality of metallic regions of the LED package 1 are allowed to have the same electrical potential to prevent ion migration. When using no auxiliary cathode, however, an unnecessary phosphor layer may be formed on the conductive regions including the metallic regions having the same electrical potential, and therefore, the phosphor layer should be removed, if desired, from those regions where such a phosphor layer is not required or desired.

In the above-described exemplary embodiments, the metallic regions containing elements or materials that have a high tendency to undergo ion migration are set to have the same potential, such as a ground potential. However, the presently disclosed subject matter is not limited to this. The same electrical potential should be imparted to the metallic regions in order to prevent ion migration. Accordingly, they are set to have a lower electrical potential than the anode potential.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents. All conventional art references described above are hereby incorporated in their entirety by reference.

What is claimed is:

1. A method for producing a color-converting light-emitting device, comprising:
   providing a light-emitting device having an electrode and a semiconductor light-emitting element;
   providing an electrodeposition apparatus including an anode, an auxiliary cathode, a solution that has light-color converting material particles dispersed therein, and a processing tank configured to accommodate the anode, the auxiliary cathode and the solution;
   placing the light-emitting device in the solution such that the anode and the light-emitting device are opposite to each other, and such that the auxiliary cathode is interposed between the light-emitting device and the anode;
   electrically connecting the electrode of the light-emitting device to the auxiliary cathode; and
   applying a DC voltage between the electrode and the anode so that an electrical potential of the electrode and the auxiliary cathode is lower than an electrical potential of the anode so as to cause the light-color converting material particles in the solution to migrate to the semiconductor light-emitting element and deposit on a surface of the semiconductor light-emitting element.

2. The method for producing a color-converting light-emitting device according to claim 1, wherein providing includes providing the auxiliary cathode with a plurality of pores for allowing the light-color converting material particles to pass therethrough.

3. The method for producing a color-converting light-emitting device according to claim 1, wherein providing includes providing the auxiliary cathode with a window formed at a position opposite to the semiconductor light-emitting element.

4. The method for producing a color-converting light-emitting device according to claim 1, wherein providing the light-emitting device having the semiconductor light-emitting element mounted thereon includes providing two or more metallic regions containing a same element selected from the group consisting of Ag, Pb, Cu, Sn, and Ni.

5. The method for producing a color-converting light-emitting device according to claim 3, wherein the window is sized to be substantially equal to a size of the semiconductor light-emitting element when viewed from a light emitting direction of the semiconductor light-emitting element.

6. The method for producing a color-converting light-emitting device according to claim 5, wherein applying a DC voltage includes creating a potential difference between at least two of the two or more metallic regions, resulting in a high potential metallic region portion and a low potential metallic region portion.

7. The method for producing a color-converting light-emitting device according to claim 6, wherein providing includes providing the auxiliary cathode with a conductor portion which is located at a position opposite to and closer to the high potential metallic region portion than the low potential metallic region portion.

8. A method for producing a color-converting light-emitting device, comprising:
   providing a light-emitting device having an electrode and a semiconductor light-emitting element;
   providing an electrodeposition apparatus including an anode, an auxiliary cathode, a solution that has light-color converting material particles dispersed therein, and a processing tank configured to accommodate the anode, the auxiliary cathode and the solution;
   placing the light-emitting device in the solution such that the anode and the light-emitting device are opposite to each other, and such that the auxiliary cathode is interposed between the light-emitting device and the anode; and
   applying a DC voltage between the electrode of the light-emitting device and the anode so that an electrical potential of the electrode is lower than an electrical potential of the anode, so as to cause the light-color converting material particles in the solution to migrate to the semiconductor light-emitting element and deposit on a surface of the semiconductor light-emitting element while an electrical potential of the auxiliary cathode is maintained lower than an electrical potential of the surface of the semiconductor light-emitting element.

9. The method for producing a color-converting light-emitting device according to claim 8, wherein providing includes providing the auxiliary cathode with a plurality of pores for allowing the light-color converting material particles to pass therethrough.

10. The method for producing a color-converting light-emitting device according to claim 8, wherein providing includes providing the auxiliary cathode with a window formed at a position opposite to the semiconductor light-emitting element.

11. The method for producing a color-converting light-emitting device according to claim 8, wherein providing the light-emitting device having the semiconductor light-emitting element mounted thereon includes providing two or more metallic regions containing a same element selected from the group consisting of Ag, Pb, Cu, Sn, and Ni.

12. The method for producing a color-converting light-emitting device according to claim 10, wherein the window is sized to be substantially equal to a size of the semiconductor light-emitting element when viewed from a light emitting direction of the semiconductor light-emitting element.

13. The method for producing a color-converting light-emitting device according to claim 11, wherein applying a DC voltage includes creating a potential difference between at least two of the two or more metallic regions, resulting in a high potential metallic region portion and a low potential metallic region portion.

14. The method for producing a color-converting light-emitting device according to claim 13, wherein providing includes providing the auxiliary cathode with a conductor portion which is located at a position opposite to and closer to the high potential metallic region portion than the low potential metallic region portion.

15. A method for producing a color-converting light-emitting device, comprising:
providing a light-emitting device having an electrode and a semiconductor light-emitting element;
providing an electrodeposition apparatus including an anode, an auxiliary cathode, a solution that has light-color converting material particles dispersed therein, and a processing tank configured to accommodate the anode, the auxiliary cathode and the solution;
placing the light-emitting device in the solution such that the anode and the light-emitting device are opposite to each other, and such that the auxiliary cathode is interposed between the light-emitting device and the anode; and
applying a DC voltage between the electrode of the light-emitting device and the anode such that an electrical potential of the electrode is lower than an electrical potential of the anode, so as to cause the light-color converting material particles in the solution to migrate to the semiconductor light-emitting element and deposit on a surface of the semiconductor light-emitting element,
wherein, in applying a DC voltage, an electrical potential of the auxiliary cathode is maintained lower than an electrical potential of the surface of the semiconductor light-emitting element so as to attract cations dissolved from any metallic region of the light-emitting device to the auxiliary cathode.

16. A method for producing a color-converting light-emitting device, comprising:
providing a light-emitting device having a plurality of conductive portions and a semiconductor light-emitting element;
providing an electrodeposition apparatus including an anode, a solution that has light-color converting material particles dispersed therein, and a processing tank configured to accommodate the anode, and the solution;
locating the light-emitting device in the solution such that the anode and the light-emitting device are opposite to each other;
electrically connecting at least two of the plurality of conductive portions of the light-emitting device in order to allow the conductive portions to have a same electrical potential;
applying a DC voltage between the light-emitting device and the anode such that an electrical potential of the semiconductor light-emitting element to which the light-color converting material particles are to be deposited is lower than an electrical potential of the anode, so as to cause the light-color converting material particles in the solution to migrate to the semiconductor light-emitting element and deposit on a surface of the semiconductor light-emitting element; and
cutting the electrical connection of the at least two of the plurality of conductive portions.

17. The method for producing a color-converting light-emitting device according to claim 16, wherein the at least two of the plurality of conductive portions contain the same element selected from the group consisting of Ag, Pb, Cu, Sn, and Ni.

18. The method for producing a color-converting light-emitting device according to claim 16, wherein providing the electrodeposition apparatus includes providing an auxiliary cathode and locating includes locating the light emitting device such that the auxiliary cathode is interposed between the light-emitting device and the anode, and wherein electrically connecting includes electrically connecting at least two of the plurality of conductive portions via the auxiliary cathode.

19. The method for producing a color-converting light-emitting device according to claim 16, wherein providing a light-emitting device includes providing a conductive layer disposed at an area of the semiconductor light-emitting element where the light-color converting material particles are to be deposited, and locating includes connecting the conductive layer to the at least two of the plurality of conductive portions so as to allow the conductive layer and the at least two of the plurality of conductive portions to have a same electrical potential.

20. The method for producing a color-converting light-emitting device according to claim 16, wherein providing the light-emitting device includes providing a reflector member having a metallic layer formed at a surface thereof, and locating includes connecting the metallic layer of the reflector member to any of the at least two of the plurality of conductive portions such that metallic layer of the reflector member and the any of the at least two of the plurality of conductive portions are at a same electrical potential.

21. The method for producing a color-converting light-emitting device according to claim 18, wherein providing the auxiliary cathode includes providing a window of a particular shape formed in the auxiliary cathode at a position opposite to the semiconductor light-emitting element such that when applying the DC voltage the light-color converting material particles pass through the window and selectively deposit on the semiconductor light-emitting element in a configuration determined by the shape of the window.

* * * * *

UNITED STATES PATENT AND TRADEMARK OFFICE
CERTIFICATE OF CORRECTION

PATENT NO. : 7,504,272 B2  Page 1 of 1
APPLICATION NO. : 11/935103
DATED : March 17, 2009
INVENTOR(S) : Shuichi Ajiki et al.

It is certified that error appears in the above-identified patent and that said Letters Patent is hereby corrected as shown below:

The Examiner has incorrectly renumbered claim 4 as claim 5 and claim 5 as claim 4. In light of this, the dependency of claim 6 needs to be amended as follows.

Col. 20, claim 6, should read:

6. The method for producing a color-converting light-emitting device according to claim 4, wherein applying a DC voltage includes creating a potential difference between at least two of the two or more metallic regions, resulting in a high potential metallic region portion and a low potential metallic region portion.

Signed and Sealed this

Tenth Day of August, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,504,272 B2 | |
| APPLICATION NO. | : 11/935103 | |
| DATED | : March 17, 2009 | |
| INVENTOR(S) | : Shuichi Ajiki et al. | |

It is certified that error appears in the above-identified patent and that said Letters Patent is hereby corrected as shown below:

The Examiner has incorrectly renumbered claim 4 as claim 5 and claim 5 as claim 4. In light of this, the dependency of claim 6 needs to be amended as follows.

Col. 20, lines 4-9, claim 6, should read:

6. The method for producing a color-converting light-emitting device according to claim 4, wherein applying a DC voltage includes creating a potential difference between at least two of the two or more metallic regions, resulting in a high potential metallic region portion and a low potential metallic region portion.

This certificate supersedes the Certificate of Correction issued August 10, 2010.

Signed and Sealed this

Thirty-first Day of August, 2010

David J. Kappos
*Director of the United States Patent and Trademark Office*